(12) United States Patent
Lai et al.

(10) Patent No.: US 12,260,924 B2
(45) Date of Patent: Mar. 25, 2025

(54) TESTABILITY CIRCUIT AND READ AND WRITE PATH DECOUPLING CIRCUIT OF SRAM

(71) Applicant: Shanghai Huali Integrated Circuit Corporation, Shanghai (CN)

(72) Inventors: Zhenan Lai, Shanghai (CN); Junsheng Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 142 days.

(21) Appl. No.: 18/172,436

(22) Filed: Feb. 22, 2023

(65) Prior Publication Data

US 2023/0410928 A1 Dec. 21, 2023

(30) Foreign Application Priority Data

May 24, 2022 (CN) .......................... 202210570900.4

(51) Int. Cl.
*G11C 11/419* (2006.01)
*G11C 29/12* (2006.01)
(52) U.S. Cl.
CPC ........ *G11C 29/1201* (2013.01); *G11C 11/419* (2013.01); *G11C 2029/1204* (2013.01)

(58) Field of Classification Search
CPC .............. G11C 11/419; G11C 29/1201; G11C 2029/1204
USPC ......................................................... 365/154
See application file for complete search history.

(56) References Cited

U.S. PATENT DOCUMENTS

| 7,643,330 B1* | 1/2010 | Lin ........................ G11C 11/412 |
|  |  | 365/189.04 |
| 2011/0149667 A1* | 6/2011 | Hamzaoglu ........... G11C 11/413 |
|  |  | 365/205 |

* cited by examiner

*Primary Examiner* — Sung Il Cho
(74) *Attorney, Agent, or Firm* — Banner & Witcoff, Ltd.

(57) ABSTRACT

The present application discloses a design for testability circuit of an SRAM. In a write path circuit detection mode of a fault diagnosis logic control module, a write path circuit is in an on state, a write data bit multiplexer is in a selected state, a read data bit multiplexer is in a deselected state, a read path circuit is in an on state, and a memory cell is in a selected state; in a read path circuit detection mode, the write path circuit is in an off state, the write data bit multiplexer is in a selected state, the read data bit multiplexer is in a deselected state, the read path circuit is in an on state, and the memory cell is in a deselected state. A bit line signal end is connected to a test signal outputted by a signal generation circuit.

13 Claims, 9 Drawing Sheets

TESTABILITY CIRCUIT AND READ AND WRITE PATH DECOUPLING CIRCUIT OF SRAM

CROSS-REFERENCE TO RELATED APPLICATIONS

This application claims the priority to Chinese patent application No. 202210570900.4, filed on May 24, 2022, the disclosure of which is incorporated herein by reference in its entirety.

TECHNICAL FIELD

The present application relates to a semiconductor integrated circuit, in particular to a Design for Testability (DFT) circuit of a Static Random Access Memory (SRAM). The present application further relates to a read and writes path decoupling circuit of an SRAM.

BACKGROUND

In addition to being an indispensable component in CPU chips, SRAM has become a widely used test vehicle in advanced process development because of its high density.

Referring to 1, it illustrates a layout of an existing SRAM. The existing SRAM includes a memory cell area 101 and an external control circuit area 102. The memory cell area 101 includes an array structure consisting of a plurality of memory cells. In a case that a fault point occurs in the memory cell area 101, it is easy to locate.

An input/output (IO) circuit and a Bit Line (BL) circuit are formed in the external control circuit area 102. In case that a fault occurs in the external control circuit area 102, because the layout in the external control circuit area 102 is relatively irregular and lacks effective design for testability, the fault location in the external control circuit area 102 is difficult, and the probability of successful fault diagnosis is greatly reduced.

Referring to FIG. 2, it illustrates an enlarged diagram of a cell structure of the external control circuit area 102 in FIG. 1. The external control circuit area 102 includes a read and write latch 103, a write driver circuit 104, a sense amplifier 105, a read and write data bit multiplexer 106, a header circuit 107, a footer circuit 108, and a pre-charge circuit 109. In FIG. 2, the read and write latch 103 is also represented by Read/Write Data Latch, the write driver circuit 104 is represented by Write Driver, the sense amplifier 105 is represented by S/A, the read and write data bit multiplexer 106 is represented by R/W MUX, the header circuit 107 is represented by Header, the footer circuit 108 is represented by Footer, and the pre-charge circuit 109 is represented by Pre-Charge.

Referring to FIG. 3A, it illustrates an SEM photo 201 of a second via layer in the external control circuit area of the existing SRAM. In the SEM photo 201, V2 represents the second via layer, and 0.5 kV and 5.0 keV represent electron beam energy.

Referring to FIG. 3B, it illustrates an SEM photo 202 of a first via layer in the external control circuit area of the existing SRAM. In the SEM photo 202, V1 represents the first via layer, and 0.5 kV and 5.0 keV represent electron beam energy.

Referring to FIG. 3C, it illustrates an SEM photo 203 of a zeroth via layer and a zeroth metal layer in the external control circuit area of the existing SRAM. In the SEM photo 203, V0 represents the zero via layer, M0 represents the zero metal layer, and 0.5 kV and 10.0 keV represent electron beam energy.

No obvious abnormality can be found from SEM photos 201 to 203, so the SEM photos cannot locate the fault in the external control circuit area 102.

Referring to FIG. 4, it illustrates a circuit diagram of a write path circuit and a read path circuit of the existing SRAM. The read path circuit includes a sense amplifier 306, a read buffer 307 and a read latch 308.

An input end of the sense amplifier 306 is connected to a bit line signal end, an output end of the sense amplifier 306 is connected to an input end of the read buffer 307, an output end of the read buffer 307 is connected to an input end of the read latch 308, and an output end of the read latch 308 outputs a read signal.

An enable signal connected to an enable end of the sense amplifier 306 is an SAE signal. An SAEN signal is an anti-phase signal of the SAE signal. In FIG. 4, the sense amplifier 306 is represented by Sense AMP. The SAEN signal is represented by /SAE. The SAE signal is directly represented by SAE.

Enable signals connected to an enable end of the read buffer 307 are an SAE signal and an SAEN signal. In FIG. 4, the read buffer 307 is represented by Read Buffer.

An enable signal connected to an enable end of the read latch 308 is an SAE signal or an SAEN signal. In FIG. 4, the read latch 308 is represented by Data Latch.

The write path circuit includes a write selector 303, a write driver circuit 304, and a write latch (not shown).

An output end of the write driver circuit 304 is connected to an input end of the write selector 303. An output end of the write selector 303 acts as an output end of the write path circuit. In FIG. 4, the write selector 303 is represented by Write Select.

An input end of the write driver circuit 304 is connected to an output end of the write latch. A pair of mutually anti-phase data DATA and /DATA are input to the input end of the write driver circuit 304.

An input end of the write latch is connected to a write signal. In FIG. 4, the write driver circuit 304 is represented by Write Driver.

An enable signal connected to an enable end of the write selector 303 is a WE signal. A WEN signal is an anti-phase signal of the WE signal. In FIG. 4, the WEN signal is represented by /WE. The WE signal is obtained by inverting the phase of the WEN signal through a phase inverter.

An enable signal connected to an enable end of the write driver circuit 304 is a WEN signal.

The memory cell area includes a memory cell array consisting of a plurality of memory cells (also called bit cells) 301. A memory cell stores one bit of data, so it is called a bit cell. An address of the memory cell 301 in the memory cell array needs to be determined by a word line and bit lines. The word line of the memory cell 301 in FIG. 4 is WL0, and the bit lines are BL0 and /BL0. Generally, WL0 indicates that the memory cell 301 is in the first row, and BL0 and /BL0 indicate that the memory cell is in the first column.

In FIG. 4, the memory cell 301 has a 6T structure, and is connected to a pair of bit lines BL0 and /BL0.

Generally, a pre-charge circuit 309 is further provided. A control end of the pre-charge circuit 309 is controlled by a PRE signal and is configured to charge the bit lines before reading and writing.

The working mode of the SRAM includes a write mode and a read mode.

In the write mode, the WE and WEN signals makes the write selector 303, the write driver circuit 304 and the write latch enabled and on, and the output end of the write selector 303 writes data to the selected memory cell 301 through a write data bit multiplexer 302. In FIG. 4, the write data bit multiplexer 302 is represented by Write MUX, and an address signal YW0 makes the write data bit multiplexer 302 corresponding to the memory cell 301 in the first column on, and writes data to the selected memory cell 301. In the write mode, the SAE signal and the SAEN signal makes the sense amplifier 306, the read buffer 307 and the read latch 308 disabled. At the same time, the address signal YR0 makes the read data bit multiplexer 305 corresponding to the memory cell 301 in the first column not selected. As can be seen from FIG. 4, the final write path is as illustrated by reference sign 310.

In the read mode, the SAE signal and the SAEN signal make the sense amplifier 306, the read buffer 307 and the read latch 308 enabled and on. At the same time, the address signal YR0 makes the read data bit multiplexer 305 corresponding to the memory cell 301 in the first column selected and on. In FIG. 4, the read data bit multiplexer 305 is also represented by Read MUX. At the same time, in the read mode, the WE and WEN signals make the write selector 303, the write driver circuit 304 and the write latch disabled, and the address signal YW0 makes the write data bit multiplexer 302 corresponding to the memory cell 301 in the first column not selected. As can be seen from FIG. 4, the final read path is as illustrated by reference sign 311.

As can be seen from the write path 310 and read path 311 in FIG. 4, in a case that the function failure of the existing SRAM is caused by the external control circuit, if it is wanted to narrow the location range, the most basic task is to confirm whether the function failure is caused by the read path circuit or the write path circuit. However, this will increase the complexity of test programming and the time for artificial determination, thus delaying the time for fault diagnosis.

BRIEF SUMMARY

According to some embodiments in this application, in the design for testability circuit of the SRAM provided by the present application, the SRAM includes a memory cell area and an external control circuit area.

A memory cell array formed by arranging a plurality of memory cells is formed in the memory cell area and the memory cells in the same column are connected to the same bit line.

The external control circuit area includes a write path circuit and a read path circuit.

An output end of the write path circuit and an input end of the read path circuit are both connected to a bit line signal end, the bit line signal end is connected to the corresponding bit line through a write data bit multiplexer, and the bit line signal end is connected to the corresponding bit line through a read data bit multiplexer.

The design for testability circuit includes a fault diagnosis logic control module.

The fault diagnosis logic control module is configured to control a fault diagnosis mode in a fault diagnosis process, and the fault diagnosis mode includes a write path circuit detection mode; in the write path circuit detection mode, the write path circuit is in an on state, the write data bit multiplexer is in a selected state, and the read data bit multiplexer is in a deselected state, the read path circuit is in an on state and the memory cell is in a selected state; the write path circuit implements the writing of the memory cell, and the read path circuit implements the reading of the bit line signal end to implement the detection of the write path circuit.

The fault diagnosis mode further includes a read path circuit detection mode.

In the read path circuit detection mode, the write path circuit is in an off state, the write data bit multiplexer is in a selected state, the read data bit multiplexer is in a deselected state, the read path circuit is in an on state, the memory cell is in a deselected state, the bit line signal end is connected to a test signal outputted by a signal generation circuit, and the read path circuit implements the reading of the test signal to implement the detection of the read path circuit.

In some cases, the read path circuit includes a sense amplifier, a read buffer and a read latch.

An input end of the sense amplifier is connected to the bit line signal end, an output end of the sense amplifier is connected to an input end of the read buffer, an output end of the read buffer is connected to an input end of the read latch, and an output end of the read latch outputs a read signal.

An enable signal connected to an enable end of the sense amplifier is an SAE signal or an SAEN signal; the SAEN signal is an anti-phase signal of the SAE signal.

An enable signal connected to an enable end of the read buffer is an SAE signal or an SAEN signal.

An enable signal connected to an enable end of the read latch is an SAE signal or an SAEN signal.

The fault diagnosis logic control module includes a DFT signal generation module configured to generate a DFT signal.

On fault diagnosis detection, the DFT signal is provided to the SAE signal.

The write path circuit includes a write selector, a write driver circuit and a write latch.

An output end of the write driver circuit is connected to an input end of the write selector, an output end of the write selector acts as the output end of the write path circuit, an input end of the write driver circuit is connected to an output end of the write latch, and an input end of the write latch is connected to a write signal.

An enable signal connected to an enable end of the write selector is a WE signal or WEN signal, and the WEN signal is an anti-phase signal of the WE signal.

An enable signal connected to an enable end of the write driver circuit is a WE signal or WEN signal, and the WEN signal is an anti-phase signal of the WE signal.

In some cases, in the write path circuit detection mode, the DFT signal makes the sense amplifier, the read buffer and the read latch enabled;

The WE signal or the WEN signal makes the write selector, the write driver circuit and the write latch enabled.

In some cases, a working mode of the SRAM includes a write mode and a read mode.

In the write mode, the write path circuit is in an on state, the write data bit multiplexer is in a selected state, the read data bit multiplexer is in a deselected state, the read path circuit is in an off state, and the memory cell is in a selected state.

In the read mode, the write path circuit is in an off state, the write data bit multiplexer is in a deselected state, the read data bit multiplexer is in a selected state, the read path circuit is in an on state, and the memory cell is in a selected state.

The external control circuit area further includes a tracking circuit, the tracking circuit includes a tracking cell, the tracking cell has the same structure as the memory cell, the tracking cell is connected to a tracking bit line, and the tracking bit line provides a tracking bit line signal.

In the write mode, the SAE signal is provided by the tracking bit line signal and makes the sense amplifier, the read buffer and the read latch disabled.

In some cases, the SAE signal is obtained by logically combining the tracking bit line signal and the DFT signal by a first logic circuit.

The write path circuit detection mode is obtained by adding the DFT signal on the basis of the write mode; in the write mode, the DFT signal is not added and the first logic circuit takes the tracking bit line signal as the SAE signal; in the write path circuit detection mode, the DFT signal is added, the first logic circuit takes the DFT signal as the SAE signal, and the DFT signal makes the write mode changed to the write path circuit detection mode.

In some cases, in a case that the SAE signal is high-level, the sense amplifier, the read buffer and the read latch are enabled.

The first logic circuit is a first OR gate.

In some cases, in the write mode, a write address signal is added to a select end of the write data bit multiplexer to make the write data bit multiplexer in a selected state.

In the read mode, a read address signal is added to a select end of the read data bit multiplexer to make the read data bit multiplexer in a selected state.

In some cases, in the read path circuit detection mode, the DFT signal is added to the select end of the read data bit multiplexer to make the read data bit multiplexer in a deselected state.

The test signal is obtained from the tracking bit line signal.

In some cases, the bit line connected to each memory cell includes an in-phase line and anti-phase line.

The bit line signal end includes an in-phase line signal end and an anti-phase line signal end.

The tracking bit line includes an in-phase tracking bit line and an anti-phase tracking bit line, and the tracking bit line signal includes an in-phase tracking bit line signal and an anti-phase tracking bit line signal.

The signal generation circuit adopts the tracking circuit, and the test signal is obtained from the anti-phase tracking bit line signal.

In some cases, a signal at the select end of the read data bit multiplexer is obtained by logically combining the read address signal and the DFT signal by a second logic circuit.

The anti-phase tracking bit line signal is input to an input end of a third logic circuit, and an output end of the third logic circuit outputs the test signal under the control of a control signal.

The read path circuit detection mode is obtained by making the memory cell in a deselected state and adding the DFT signal and the control signal of the third logic circuit on the basis of the read mode.

In the read mode, the DFT signal and the control signal of the third logic circuit are not added, the second logic circuit makes the signal at the select end of the read data bit multiplexer be the read address signal, and the third logic circuit makes the test signal not outputted to the bit line signal end; in the read path circuit detection mode, the DFT signal and the control signal of the third logic circuit are added, the second logic circuit makes the signal at the select end of the read data bit multiplexer be the DFT signal, and the third logic circuit makes the test signal outputted to the bit line signal end.

In some cases, in a case that the signal at the select end of the read data bit multiplexer is low-level, the read data bit multiplexer is made in a selected state, and in a case that the signal at the select end of the read data bit multiplexer is high-level, the read data bit multiplexer is made in a deselected state.

The second logic circuit is a first OR NOT gate.

In some cases, the third logic circuit includes a first transmission gate and a second transmission gate.

An input end of the first transmission gate is connected to the anti-phase tracking bit line signal, and an output end of the first transmission gate is connected to the in-phase bit line signal end.

An input end of the second transmission gate is connected to the anti-phase tracking bit line signal, and an output end of the second transmission gate is connected to the anti-phase bit line signal end.

The control signal of the third logic circuit includes a first select signal and a second select signal which are mutually anti-phase.

A in-phase control end of the first transmission gate and a anti-phase control end of the second transmission gate are connected to the first select signal.

A anti-phase control end of the first transmission gate and a in-phase control end of the second transmission gate are connected to the second select signal.

In order to solve the technical problem, in the read and write path decoupling circuit of the SRAM provided by the present application, the SRAM includes a memory cell area and an external control circuit area.

A memory cell array formed by arranging a plurality of memory cells is formed in the memory cell area and the memory cells in the same column are connected to the same bit line.

The external control circuit area includes a write path circuit and a read path circuit.

An output end of the write path circuit and an input end of the read path circuit are both connected to a bit line signal end, the bit line signal end is connected to the corresponding bit line through a write data bit multiplexer, and the bit line signal end is connected to the corresponding bit line through a read data bit multiplexer.

Each memory cell adopts a 1RW single-port structure.

The read and write path decoupling circuit is configured to implement read and write modes in a working process of the SRAM; in the read and write modes, the write path circuit is in an on state, the write data bit multiplexer is in a selected state, the read data bit multiplexer is in a deselected state, the read path circuit is in an on state, and the memory cell is in a selected state; the write path circuit implements the writing of the memory cell and makes an input end of the write path circuit be a write port, the read path circuit implements the reading of the bit line signal end and makes an output end of the read path circuit be a read port, so that the memory cell with the 1RW single-port structure realizes a dual-port function to improve storage density.

In some cases, the read path circuit includes a sense amplifier, a read buffer and a read latch.

An input end of the sense amplifier is connected to the bit line signal end, an output end of the sense amplifier is connected to an input end of the read buffer, an output end of the read buffer is connected to an input end of the read latch, and an output end of the read latch outputs a read signal.

An enable signal connected to an enable end of the sense amplifier is an SAE signal or an SAEN signal; the SAEN signal is an anti-phase signal of the SAE signal.

An enable signal connected to an enable end of the read buffer is an SAE signal or an SAEN signal.

An enable signal connected to an enable end of the read latch is an SAE signal or an SAEN signal.

The write path circuit includes a write selector, a write driver circuit and a write latch.

An output end of the write driver circuit is connected to an input end of the write selector, an output end of the write selector acts as the output end of the write path circuit, an input end of the write driver circuit is connected to an output end of the write latch, and an input end of the write latch is connected to a write signal.

An enable signal connected to an enable end of the write selector is a WE signal or WEN signal, and the WEN signal is an anti-phase signal of the WE signal.

An enable signal connected to an enable end of the write driver circuit is a WE signal or WEN signal, and the WEN signal is an anti-phase signal of the WE signal.

The read and write path decoupling circuit includes a fourth logic circuit, and in the read and write modes, the fourth logic circuit provides read and write control signals to the SAE signal.

In some cases, the fourth logic circuit includes a first OR gate, a D flip-flop and a second OR gate.

A first input end of the second OR gate is connected to a write clock signal, a second input end is connected to a read clock signal, and an output end of the second OR gate is connected to a reset end of the D flip-flop.

a clock end of the D flip-flop is connected to an address transition detection signal, and a D end is connected to working voltage;

A first input end of the first OR gate is connected to a Q end of the D flip-flop, a second input end of the first OR gate is connected to a tracking bit line signal, and an output end of the first OR gate outputs the SAE signal.

The fault diagnosis logic control module of the design for testability circuit of the SRAM provided by the present application can set and control the fault diagnosis mode in the fault diagnosis process. The write path circuit detection mode can make the read path circuit on under the condition that the memory cell is written through the write path circuit, so that the write path circuit can be detected through the reading of the read path circuit. The read path circuit detection mode can turn off the reading of the memory cell and change to read the set test signal under the condition that the read path circuit is on, thus implementing the detection of the read path circuit, and improving the determination ability and efficiency of functional failure faults in the write path circuit and the read path circuit in the fault diagnosis process.

The read and write path decoupling circuit of the SRAM provided by the present application can implement the read and write modes by changing the write path circuit detection mode of the design for testability circuit accordingly, and can simultaneously implement the write operation and read operation of the memory cell with the 1RW single-port structure in the same read and write cycle, so that the memory cell with the 1RW single-port structure can realize a dual-port function, thus improving the storage density of the SRAM with the dual-port function.

BRIEF DESCRIPTION OF THE DRAWINGS

The present application will be further described in detail below in combination with the embodiments with reference to the drawings.

DETAILED DESCRIPTION OF THE APPLICATION

Figure 1:
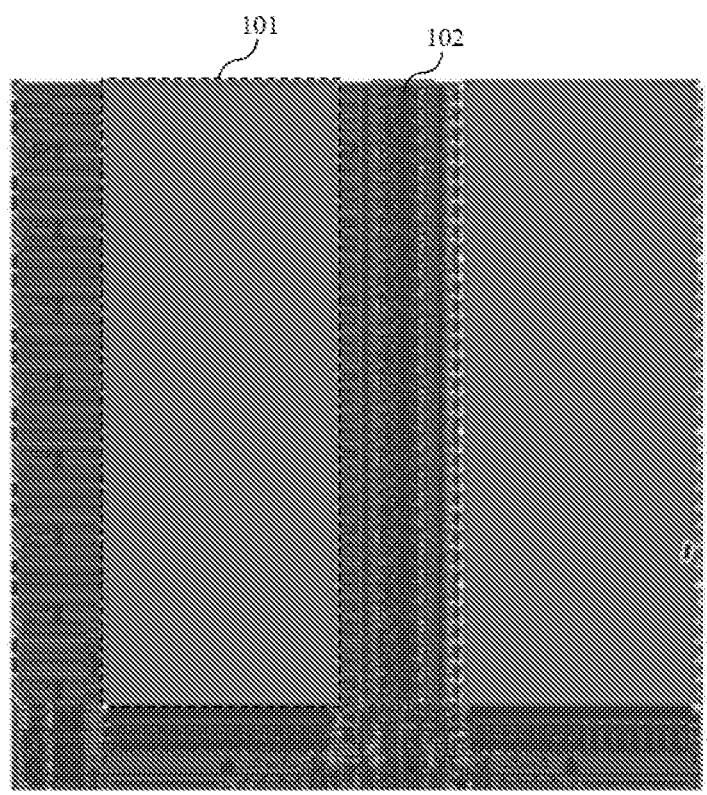
FIG. 1 illustrates a layout of an existing SRAM.
Figure 2:
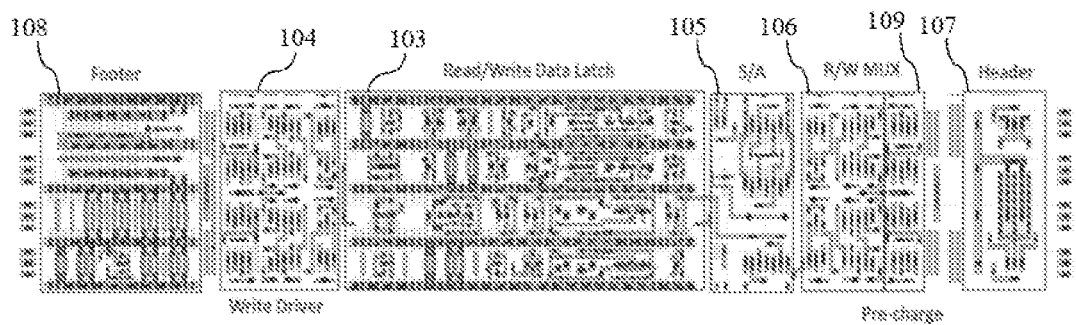
FIG. 2 illustrates an enlarged diagram of a cell structure of an external control circuit area in FIG. 1.
Figure 3A:
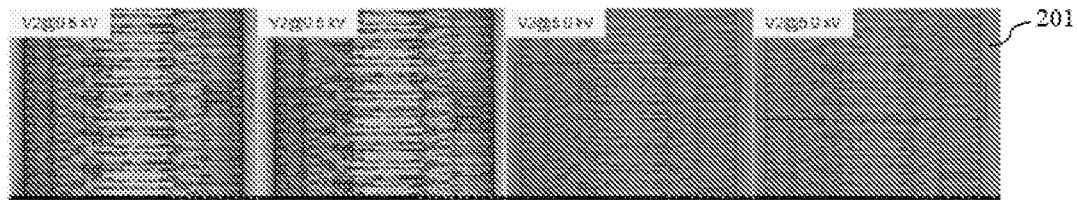
FIG. 3A illustrates an SEM photo of a second via layer in an external control circuit area of an existing SRAM.
Figure 3B:
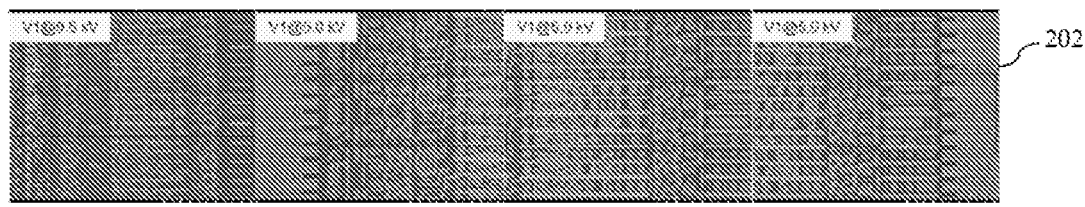
FIG. 3B illustrates an SEM photo of a first via layer in an external control circuit area of an existing SRAM.
Figure 3C:
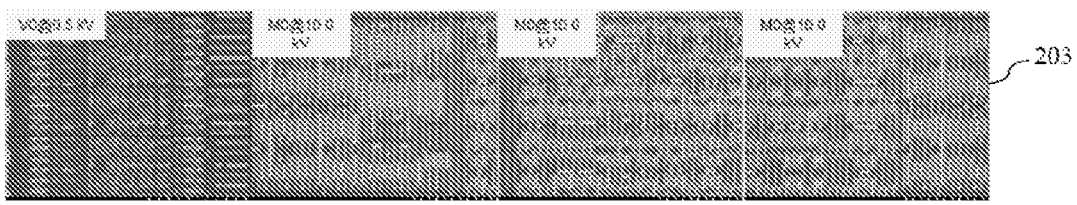
FIG. 3C illustrates an SEM photo of a zeroth via layer and a zeroth metal layer in an external control circuit area of an existing SRAM.
Figure 4:
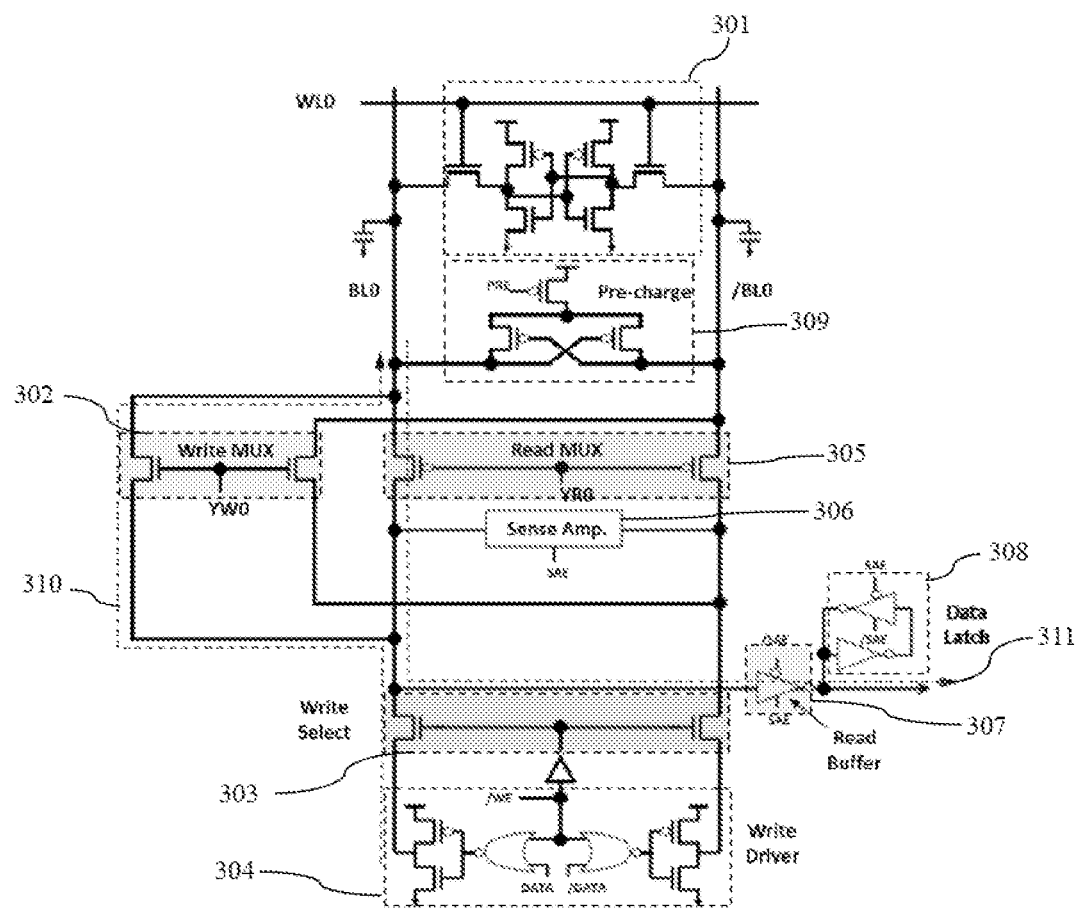
FIG. 4 illustrates a circuit diagram of a write path circuit and a read path circuit of an existing SRAM.
Figure 5A:
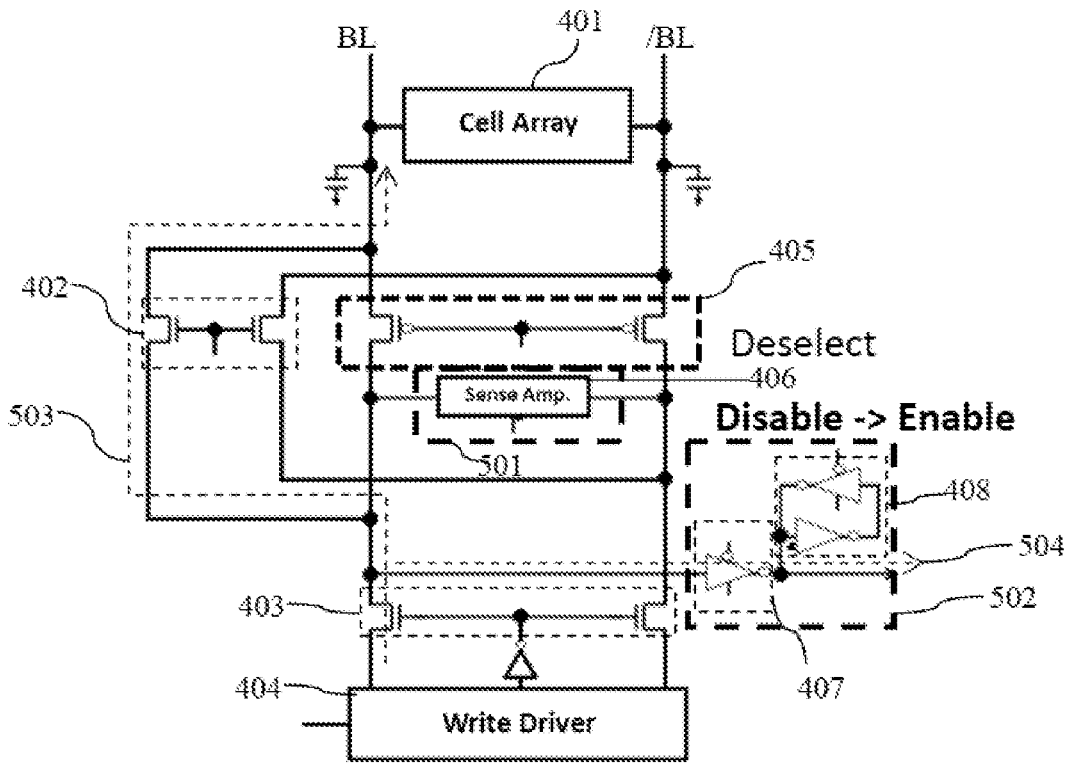
FIG. 5A illustrates a circuit diagram of a design for testability circuit of an SRAM in a write path circuit detection mode according to an embodiment of the present application.
Figure 5B:
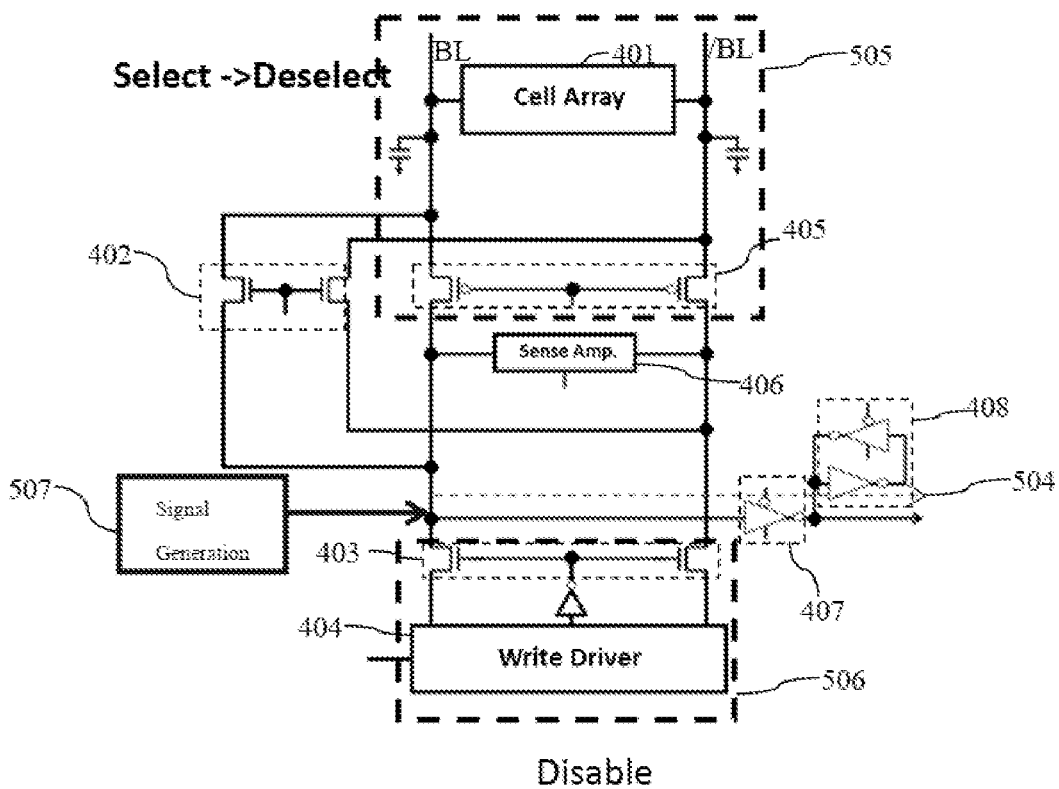
FIG. 5B illustrates a circuit diagram of a design for testability circuit of an SRAM in a read path circuit detection mode according to an embodiment of the present application.

Referring to FIG. 5, it illustrates a circuit diagram of a design for testability circuit of an SRAM in a write path circuit detection mode according to an embodiment of the present application. Referring to FIG. 5B, it illustrates a circuit diagram of a design for testability circuit of an SRAM in a read path circuit detection mode according to an embodiment of the present application. In the design for testability circuit of the SRAM according to the embodiment of the present application, the SRAM includes a memory cell area and an external control circuit area.

Referring to FIG. 5A, a memory cell array 401 formed by arranging a plurality of memory cells is formed in the memory cell area and the memory cells in the same column are connected to the same bit line. In the embodiment of the present application, the memory cell is connected with a pair of bit lines BL and /BL which are mutually anti-phase. The memory cell is selected through a word line and a bit line. In FIG. 5A, the memory cell array 401 is also represented by Cell Array, and a structure of the memory cell in the memory cell array 401 is not illustrated separately.

Figure 7A:
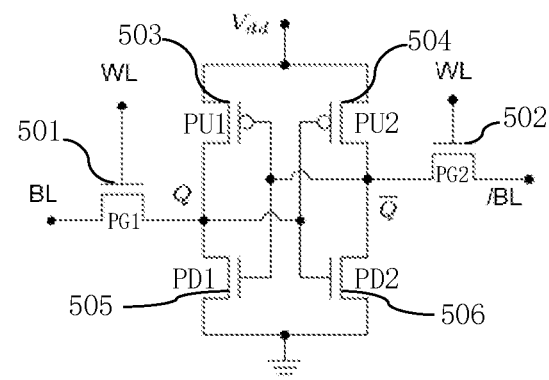
FIG. 7A illustrates a circuit diagram of a 1RW 6T memory cell of an SRAM according to an embodiment of the present application.

In the embodiment of the present application, the structure of the memory cell adopts a 1RW 6T memory cell as illustrated in FIG. 7A. 1 in 1RW represents one port, R represents reading, W represents writing, and 1RW represents reading and writing simultaneously adopt one port. 6T represents that one memory cell includes six transistors. The six transistors include a first select transistor 501, a second select transistor 502, a first pull-up transistor 503, a second pull-up transistor 504, a first pull-down transistor 505 and a second pull-down transistor 506. Grids of the first select transistor 501 and the second select transistor 502 are connected to the word line WL. A drain of the first select transistor 501 is connected with the bit line /BL. A drain of the second select transistor 502 is connected to the bit line BL. In FIG. 7A, the first select transistor 501 is represented by PG1, the second select transistor 502 is represented by PG2, the first pull-up transistor 503 is represented by PU1, the second pull-up transistor 504 is represented by PU2, the first pull-down transistor 505 is represented by PD1, and the second pull-down transistor 506 is represented by PD2.

The external control circuit area includes a write path circuit and a read path circuit.

An output end of the write path circuit and an input end of the read path circuit are both connected to a bit line signal end. The bit line signal end is connected to the corresponding bit line through a write data bit multiplexer, 402. The bit line signal end is connected to the corresponding bit line through a read data bit multiplexer 405. As can be seen from FIG. 5, in the embodiment of the present application, the write data bit multiplexer 402 consists of two NMOS transistors, and the read data bit multiplexer 405 consists of two PMOS transistors.

The design for testability circuit includes a fault diagnosis logic control module.

The fault diagnosis logic control module is configured to control a fault diagnosis mode in a fault diagnosis process.

Referring to FIG. 5A, the fault diagnosis mode includes a write path circuit detection mode. In the write path circuit detection mode, the write path circuit is in an on state, the write data bit multiplexer 402 is in a selected state, and the read data bit multiplexer 405 is in a deselected state, the read path circuit is in an on state and the memory cell is in a selected state; the write path circuit implements the writing of the memory cell, and the read path circuit implements the reading of the bit line signal end to implement the detection of the write path circuit. In FIG. 5A, the read data bit multiplexer 405 in the deselected state is separately represented by Deselect.

Referring to FIG. 5B, the fault diagnosis mode further includes a read path circuit detection mode. In the read path circuit detection mode, the write path circuit is in an off state, the write data bit multiplexer 402 is in a selected state, the read data bit multiplexer 405 is in a deselected state, the read path circuit is in an on state, the memory cell is in a deselected state, the bit line signal end is connected to a test signal outputted by a signal generation circuit 507, and the read path circuit implements the reading of the test signal to implement the detection of the read path circuit. In FIG. 5B, the signal generation circuit 507 is represented by Signal Generation.

In the embodiment of the present application, the read path circuit includes a sense amplifier 406, a read buffer 407 and a read latch 408.

An input end of the sense amplifier 406 is connected to the bit line signal end. An output end of the sense amplifier 406 is connected to an input end of the read buffer 407. An output end of the read buffer 407 is connected to an input end of the read latch 408. An output end of the read latch 408 outputs a read signal.

An enable signal connected to an enable end of the sense amplifier 406 is an SAE signal or an SAEN signal. The SAEN signal is an anti-phase signal of the SAE signal.

An enable signal connected to an enable end of the read buffer 407 is an SAE signal or an SAEN signal. As can be seen from FIG. 5A, the read buffer 407 consists of a phase inverter with an enable end.

An enable signal connected to an enable end of the read latch 408 is an SAE signal or an SAEN signal. As can be seen from FIG. 5A, the read latch 408 is formed by interlocking a phase inverter with an enable end and a phase inverter without an enable end.

The fault diagnosis logic control module includes a DFT signal generation module configured to generate a DFT signal.

In fault diagnosis detection, the DFT signal is provided to the SAE signal.

In the embodiment of the present application, the write path circuit includes a write selector 403, a write driver circuit 404 and a write latch (not shown).

An output end of the write driver circuit 404 is connected to an input end of the write selector 403. An output end of the write selector 403 acts as the output end of the write path circuit. An input end of the write driver circuit 404 is connected to an output end of the write latch. An input end of the write latch is connected to a write signal.

An enable signal connected to an enable end of the write selector 403 is a WE signal or WEN signal. The WEN signal is an anti-phase signal of the WE signal. As can be seen from FIG. 5A, the write selector 403 consists of a pair of NMOS.

An enable signal connected to an enable end of the write driver circuit 404 is a WE signal or WEN signal. The WEN signal is an anti-phase signal of the WE signal.

In the embodiment of the present application, In the write path circuit detection mode, the DFT signal makes the sense amplifier 406, the read buffer 407 and the read latch 408 enabled.

The WE signal or the WEN signal makes the write selector 403, the write driver circuit 404 and the write latch enabled.

A working mode of the SRAM includes a write mode and a read mode;

Referring to FIG. 5A, in the write mode, the write path circuit is in an on state, the write data bit multiplexer 402 is in a selected state, the read data bit multiplexer 405 is in a deselected state, the read path circuit is in an off state, and the memory cell is in a selected state. The off state of the read path circuit refers to that the sense amplifier 406, the read buffer 407 and the read latch 408 are disabled.

By comparing the write path circuit detection mode and the write mode, it can be seen that the difference between them is that the read path circuit in the write path circuit detection mode is in an on state. Therefore, the write path circuit detection mode can be obtained by enabling the sense amplifier 406, the read buffer 407 and the read latch 408 on the basis of the write mode. In FIG. 5A, Disable represents disabling, Enable represents enabling, and Disable→Enable represents that the circuit in the dotted frame 501 and 502 is switched from a disabled state to an enabled state. This switching vividly shows the switching from the write mode to the write path circuit detection mode. The dotted frame 501 has the sense amplifier 406 and the dotted frame 502 has the read buffer 407 and the read latch 408. In the write path circuit detection mode, two on paths, namely a first on path 503 and a second on path 504 represented by dotted lines with arrows are included at the same time. The first on path 503 includes a write path. The second on path 504 is a read path that reads directly from the bit line signal end. The second on path 504 does not read the memory cell through the read data bit multiplexer 405, but reading the written data can still be achieved by reading the bit line signal end. In FIG. 5A, the sense amplifier 406 is represented by Sense AMP. It can be seen that the sense amplifier 406, the read buffer 407 and the read latch 408, which are originally turned off, are turned on in the write mode in the embodiment of the present application, so that data can be written and read at the same time, thus detecting whether the write path is normal.

In the read mode, the write path circuit is in an off state, the write data bit multiplexer 402 is in a deselected state, the read data bit multiplexer 405 is in a selected state, the read path circuit is in an on state, and the memory cell is in a selected state. The write path circuit is in an off state, which represents that the write selector 403, the write driver circuit 404 and the write latch are disabled, that is, the circuit in the area illustrated by the dotted frame 506 in FIG. 5B is in a disabled state, and the circuit in the dotted frame 506 includes the write selector 403, the write driver circuit 404 and the write latch. Compared with the read mode, the read path circuit detection mode is to switch the circuit of the area illustrated by the dotted frame 505 from a selected state to a deselected state under the condition of keeping the circuit in the area illustrated by the dotted frame 506 in a disabled state. In FIG. 5B, Select→Deselect represents that the selected state is switched to the deselected state. Select represents the selected state. The circuit in the dotted frame 505 includes the memory cell in the memory cell array 401 and the read data bit multiplexer 405, so that even if the write data bit multiplexer 402 is in a selected state, it can still ensure that the data in the memory cell will not be read out. The read path is the second on path 504 illustrated by a dotted line with an arrow. The read data is a test signal outputted by the signal generation circuit 507. Since the test signal is a preset known signal, it is possible to determine whether the read path is correct by reading the test signal.

Figure 6A:
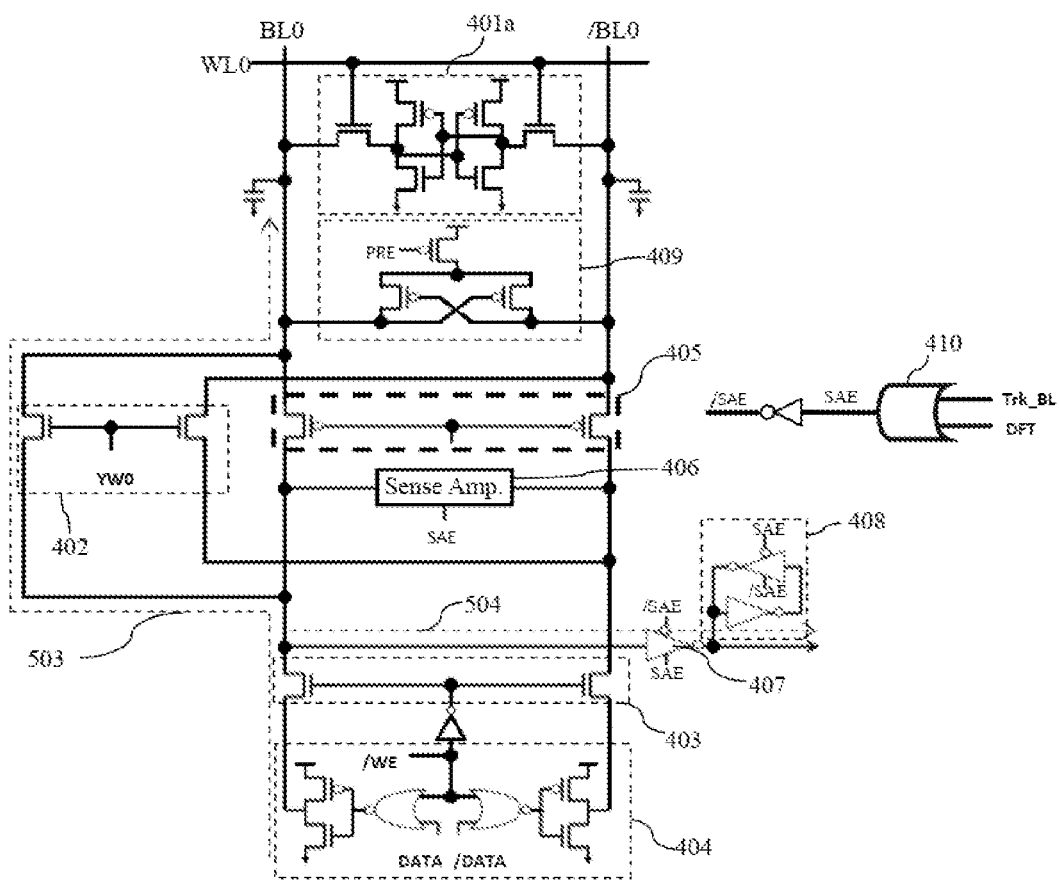
FIG. 6A illustrates a circuit diagram of a design for testability circuit of an SRAM in a write path circuit detection mode according to a preferred embodiment of the present application.

Referring to FIG. 6A, it illustrates a circuit diagram of a design for testability circuit of an SRAM in a write path circuit detection mode according to a preferred embodiment of the present application. The design for testability circuit of the SRAM according to the preferred embodiment of the present application is formed through further improvement on the basis of the design for testability circuit of the SRAM according to the embodiment of the present application in FIG. 5A. Referring to FIG. 6A, it illustrates a selected memory cell 401a. An address of the memory cell 401a in the memory cell array 401 in FIG. 5A needs to be determined by a word line and bit lines. The word line of the memory cell 401a illustrated in FIG. 6A is WL0, and the bit lines are BL0 and /BL0. Generally, WL0 represents that the memory cell 401a is in the first row, and BL0 and /BL0 represent that the memory cell is in the first column. The memory cell 401a illustrated in FIG. 6A is a 1RW 6T memory cell illustrated in FIG. 7A.

A pre-charge circuit 409, which is connected with the bit lines and configured to pre-charge the bit lines, is provided. A control end of the pre-charge circuit 409 is controlled by a PRE signal, which is configured to charge the bit lines before reading and writing.

The two NMOS transistors of the write data bit multiplexer 402 are made on through a write address signal YW0, so that the write data bit multiplexer 402 is in a selected state.

In FIG. 6A, the SAEN signal is represented by /SAE, and the SAE signal is directly represented by SAE.

An enable signal connected to an enable end of the sense amplifier 406 is an SAE signal.

Enable signals connected to an enable end of the read buffer 407 are an SAE signal and an SAEN signal.

An enable signal connected to an enable end of the read latch 408 is an SAE signal or an SAEN signal.

The WEN signal is represented by /WE. The WE signal is obtained by inverting the phase of the WEN signal through a phase inverter (not shown).

The data input at the input end of the write driver circuit 404 is a pair of data DATA and /DATA which are mutually anti-phase.

Figure 6B:
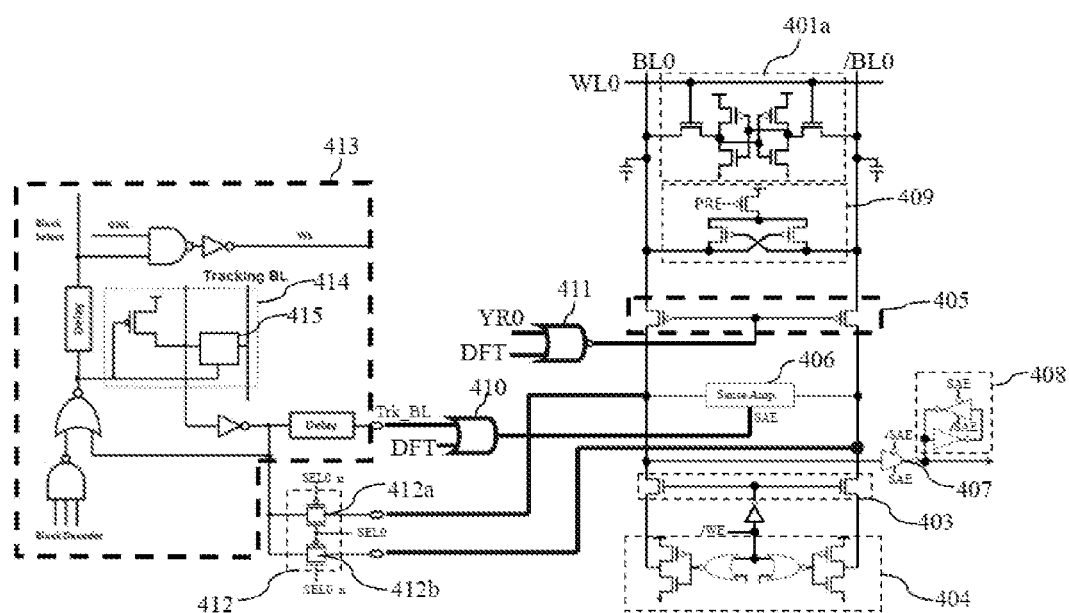
FIG. 6B illustrates a circuit diagram of a design for testability circuit of an SRAM in a read path circuit detection mode according to a preferred embodiment of the present application.

Referring to FIG. 6B, the external control circuit area further includes a tracking circuit 413. The tracking circuit 413 includes a tracking cell 415. The tracking cell 415 has the same structure as the memory cell. The tracking cell 415 is connected to a tracking bit line. The tracking bit line provides a tracking bit line signal. In FIG. 6B, the tracking cell 415 is located in the dotted frame 414, the tracking bit line is represented by Tracking BL, and the number of the tracking bit line is two in a pair.

Back to FIG. 6A, in the write mode, the SAE signal is provided by the tracking bit line signal and makes the sense amplifier 406, the read buffer 407 and the read latch 408 disabled. In FIG. 6A, the tracking bit line signal provided to the SAE signal is separately represented by Trk_BL.

The SAE signal is obtained by logically combining the tracking bit line signal and the DFT signal by a first logic circuit 410. The write path circuit detection mode is obtained by adding the DFT signal on the basis of the write mode. In the write mode, the DFT signal is not added and the first logic circuit 410 takes the tracking bit line signal as the SAE signal. In the write path circuit detection mode, the DFT signal is added, the first logic circuit 410 takes the DFT signal as the SAE signal, and the DFT signal makes the write mode changed to the write path circuit detection mode.

In a case that the SAE signal is high-level, the sense amplifier 406, the read buffer 407 and the read latch 408 are enabled. The first logic circuit 410 is a first OR gate. In other embodiments, the first logic circuit 410 may be other circuits that can realize the same logic.

Referring to FIG. 6B, in the read mode, a read address signal YR0 is added to a select end of the read data bit multiplexer 405 to make the read data bit multiplexer 405 in a selected state.

In the read path circuit detection mode, the DFT signal is added to the select end of the read data bit multiplexer 405 to make the read data bit multiplexer 405 in a deselected state;

The test signal is obtained from the tracking bit line signal.

The bit line connected to each memory cell includes an in-phase line and anti-phase line.

The bit line signal end includes an in-phase line signal end and an anti-phase line signal end.

The tracking bit line includes an in-phase tracking bit line and an anti-phase tracking bit line. The tracking bit line signal includes an in-phase tracking bit line signal and an anti-phase tracking bit line signal.

The signal generation circuit 507 adopts the tracking circuit 413. The test signal is obtained from the anti-phase tracking bit line signal in the tracking bit line signal.

A signal at the select end of the read data bit multiplexer 405 is obtained by logically combining the read address signal YR0 and the DFT signal by a second logic circuit 411.

The anti-phase tracking bit line signal is input to an input end of a third logic circuit 412. An output end of the third logic circuit 412 outputs the test signal under the control of a control signal. As can be seen from FIG. 6B, there is a delay circuit between the anti-phase tracking bit line signal provided to the first logic circuit 411 and the anti-phase tracking bit line signal provided to the third logic circuit 412. The delay circuit is represented by delay in FIG. 6B.

The read path circuit detection mode is obtained by making the memory cell in a deselected state and adding the DFT signal and the control signal of the third logic circuit 412 on the basis of the read mode.

In the read mode, the DFT signal and the control signal of the third logic circuit 412 are not added, the second logic circuit 411 makes the signal at the select end of the read data bit multiplexer 405 be the read address signal YR0, and the third logic circuit 412 makes the test signal not outputted to the bit line signal end. In the read path circuit detection mode, the DFT signal and the control signal of the third logic circuit 412 are added, the second logic circuit 411 makes the signal at the select end of the read data bit multiplexer 405 be the DFT signal, and the third logic circuit 412 makes the test signal outputted to the bit line signal end.

In a case that the signal at the select end of the read data bit multiplexer 405 is low-level, the read data bit multiplexer 405 is made in a selected state, and in a case that the signal at the select end of the read data bit multiplexer 405 is high-level, the read data bit multiplexer 405 is made in a deselected state.

The second logic circuit 411 is a first OR NOT gate.

The third logic circuit 412 includes a first transmission gate 412a and a second transmission gate 412b.

An input end of the first transmission gate 412a is connected to the anti-phase tracking bit line signal. An output end of the first transmission gate 412a is connected to the in-phase bit line signal end.

An input end of the second transmission gate 412b is connected to the anti-phase tracking bit line signal. An output end of the second transmission gate 412a is connected to the anti-phase bit line signal end.

The control signal of the third logic circuit 412 includes a first select signal SEL0 and a second select signal SEL0_n which are mutually anti-phase.

A in-phase control end of the first transmission gate 412a and a anti-phase control end of the second transmission gate 412b are connected to the first select signal SEL0.

A anti-phase control end of the first transmission gate 412a and a in-phase control end of the second transmission gate 412b are connected to the second select signal SEL0_n.

The fault diagnosis logic control module of the design for testability circuit of the SRAM provided by the embodiment of the present application can set and control the fault diagnosis mode in the fault diagnosis process. The write path circuit detection mode can make the read path circuit on under the condition that the memory cell is written through the write path circuit, so that the write path circuit can be detected through the reading of the read path circuit. The read path circuit detection mode can turn off the reading of the memory cell and change to read the set test signal under the condition that the read path circuit is on, thus implementing the detection of the read path circuit, and improving the determination ability and efficiency of functional failure faults in the write path circuit and the read path circuit in the fault diagnosis process.

Figure 7B:
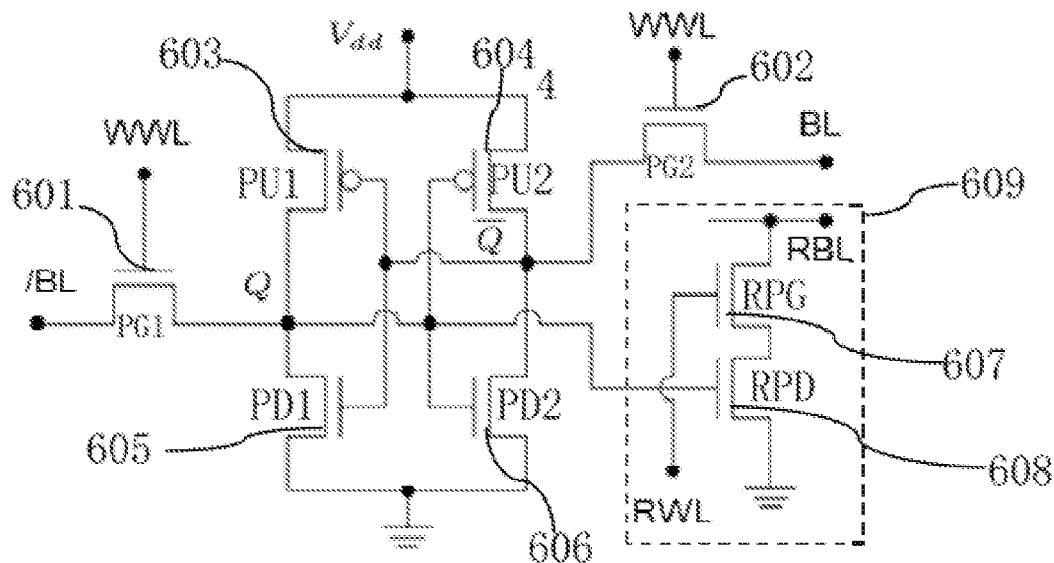
FIG. 7B illustrates a circuit diagram of a 1RW 8T memory cell of an existing SRAM.

Referring to FIG. 7B, it illustrates a circuit diagram of a 1R1W 8T memory cell of an existing SRAM. 1R represents one read port, 1 W represents one write port, and 8T represents eight transistors. The eight transistors are respectively a first select transistor 601, a second select transistor 602, a first pull-up transistor 603, a second pull-up transistor 604, a first pull-down transistor 605, a second pull-down transistor 606, a read select transistor 607, and a read pull-down transistor 608. Grids of the first select transistor 601 and the second select transistor 602 are connected to a write word line WWL. A drain of the first select transistor 601 is connected to a bit line /BL. A drain of the second select transistor 602 is connected to a bit line BL. In FIG. 7B, the first select transistor 601 is represented by PG1, the second select transistor 602 is represented by PG2, the first pull-up transistor 603 is represented by PU1, the second pull-up transistor 604 is represented by PU2, the first pull-down transistor 605 is represented by PD1, and the second pull-down transistor 606 is represented by PD2. The read select transistor 607 is represented by RPG, and the read pull-down transistor 608 is represented by RPD. FIG. 7A is different. FIG. 7B has the read select transistor 607 and the read pull-down transistor 608 in the dotted frame 609. The bit line of the read select transistor 607 is connected to a read bit line RBL, and a grid of the read select transistor 607 is connected with a read word line RWL. A grid of the read pull-down transistor 608 is connected to a storage node Q.

Figure 7C:
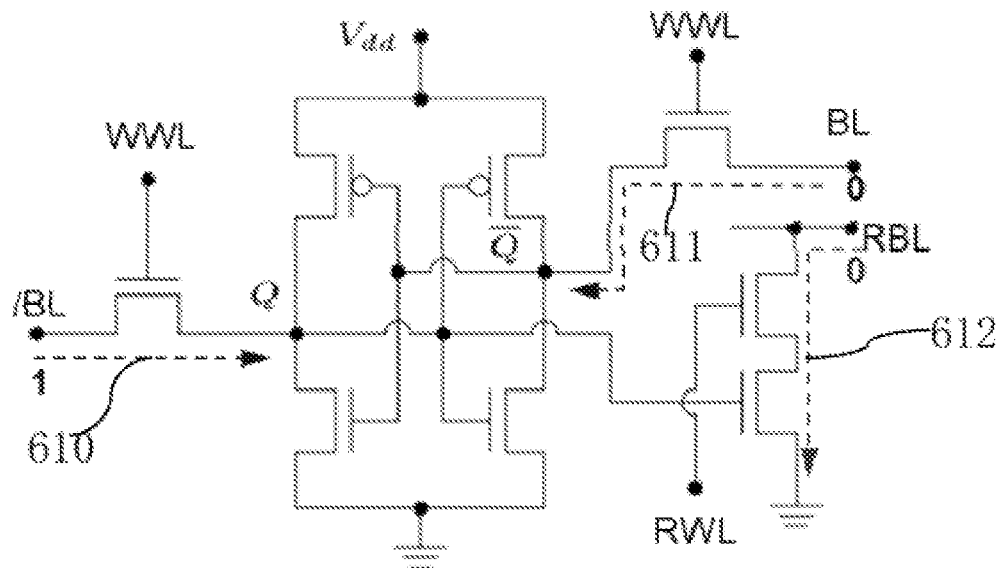
FIG. 7C illustrates a circuit diagram of a write path and a read path of the 1R1W 8T memory cell of the existing SRAM in FIG. 7B.

Signals of the write word line WWL and bit lines BL and /BL can be added separately from the write port, and signals of the read word line RWL and the read bit line RBL can be added separately from the read port, so the functions of reading and writing can be realized simultaneously in the same read and write cycle. Referring to FIG. 7C, it illustrates a circuit diagram of a write path and a read path of the 1R1W 8T memory cell of the existing SRAM illustrated in FIG. 7B. The write path of data 1 is as illustrated by the dotted line 610 with an arrow, the write path of data 0 is as illustrated by the dotted line 611 with an arrow, and the read path is as illustrated by the dotted line 612 with an arrow.

Figure 7D:
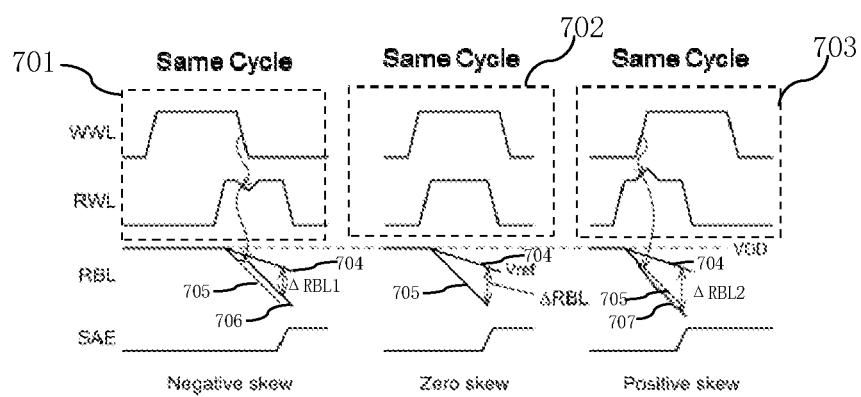
FIG. 7D illustrates a time-varying diagram of signals of the 1R1W 8T memory cell of the existing SRAM in FIG. 7B in three kinds of read and write cycles.

Referring to FIG. 7D, it illustrates a time-varying diagram of signals of the 1R1W 8T memory cell of the existing SRAM illustrated in FIG. 7B in three kinds of read and write cycles. The three kinds of read and write cycles in FIG. 7D are represented by reference signs 701, 702 and 703 respectively, which are the same in cycle size and are all represented by Same Cycle.

In FIG. 7D, the WWL signal represents the signal of the write word line WWL, the RWL signal represents the signal of the read word line WWL, the RBL signal represents the signal of the read bit line RBL, and the SAE signal represents the enable signal of the sense amplifier.

In the read and write cycle 701, the WWL signal is earlier than the RWL signal, which is written first and then read. In the read and write cycle 702, the WWL signal and RWL signal are synchronized and read and written simultaneously. In the 703 read and write cycle, the WWL signal is later than the RWL signal, which is read first and then written.

From the variation of the RWL signal, it can be seen that in the read and write cycle 701, the high level of the RWL signal will decrease at the falling edge of the WWL signal, so it has a negative skew illustrated in FIG. 7D, which makes the actual falling line of the RWL signal be the solid line 706, the value of which is greater than the value of the dotted line 705. The difference between the solid line 706 and the reference line 704 is ΔRBL1.

In the read and write cycle 702, the high level of the RWL signal will not change, that is, it has a zero skew as illustrated in FIG. 7D, which makes the actual falling line of the RWL signal be the line 705. The difference between the line 705 and the reference line 704 is ΔRBL.

In the read and write cycle 703, the high level of the RWL signal will rise at the rising edge of the WWL signal, so it has a positive skew as illustrated in FIG. 7D, which makes the actual falling line of the RWL signal be the solid line 707, the value of which is less than the value of the dotted line 705. The difference between the solid line 707 and the reference line 704 is ΔRBL2.

As can be seen, ΔRBL1 is less than ΔRBL and ΔRBL2 is greater than ΔRBL. Therefore, the read window of RBL2 is larger.

Compared with the 1RW 6T memory cell illustrated in FIG. 7A, the 1R1W 8T memory cell illustrated in FIG. 7B can realize read and write operations in the same cycle, but it will increase the area.

Figure 8:
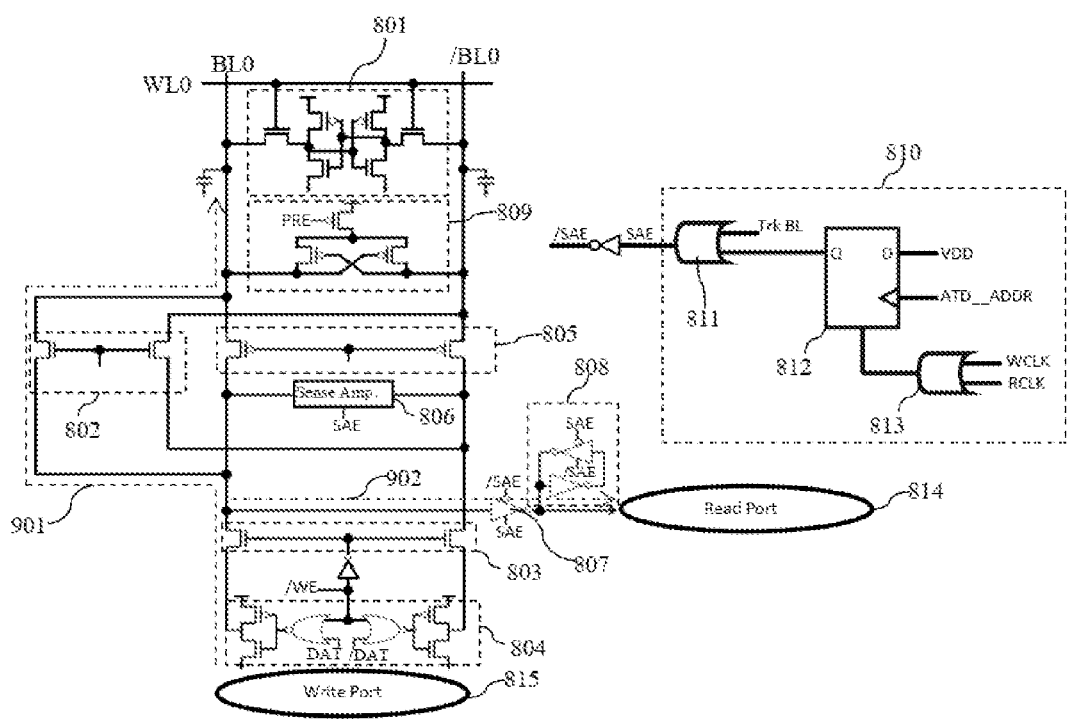
FIG. 8 illustrates a circuit diagram of a read and write path decoupling circuit of an SARM according to an embodiment of the present application.

Referring to FIG. 8, it illustrates a circuit diagram of a read and write path decoupling circuit of an SARM according to an embodiment of the present application. In the read and write path decoupling circuit of the SARM according to the embodiment of the present application, the SRAM includes a memory cell area and an external control circuit area.

A memory cell array formed by arranging a plurality of memory cells 801 is formed in the memory cell area and the memory cells 801 in the same column are connected to the same bit line. FIG. 8 illustrates a selected memory cell 801. An address of the memory cell 801 in the memory cell array needs to be determined by a word line and bit lines. The word line of the memory cell 801 illustrated in FIG. 8 is WL0, and the bit lines are BL0 and /BL0. Generally, WL0 represents that the memory cell 801 is in the first row, and BL0 and /BL0 represent that the memory cell 801 is in the first column. The memory cell 801 illustrated in FIG. 8 uses the 1RW 6T memory cell illustrated in FIG. 7A.

A pre-charge circuit 809 connected to the bit line and used for pre-charging the bit line is provided. A control end of the pre-charge circuit 809 is controlled by a PRE signal, and it is used for charging the bit line before reading and writing.

The external control circuit area includes a write path circuit and a read path circuit.

An output end of the write path circuit and an input end of the read path circuit are both connected to a bit line signal end. The bit line signal end is connected to the corresponding bit line through a write data bit multiplexer 802. The bit line signal end is connected to the corresponding bit line through a read data bit multiplexer 805.

The read and write path decoupling circuit is configured to implement read and write modes in a working process of the SRAM. In the read and write modes, the write path circuit is in an on state, the write data bit multiplexer 802 is in a selected state, the read data bit multiplexer 805 is in a deselected state, the read path circuit is in an on state, and the memory cell 801 is in a selected state. From FIG. 8, it can be seen that the dotted line 901 with an arrow represents an on path for writing data DATA and /DATA to the memory cell 801 through the write path circuit; the dotted line 902 with an arrow represents an on path for reading data through the read path circuit. The write path circuit implements the writing of the memory cell 801 and makes an input end of the write path circuit be a write port 815. The read path circuit implements the reading of the bit line signal end and makes an output end of the read path circuit be a read port 814, so that the memory cell 801 with the 1RW single-port structure realizes a dual-port function to improve storage density. In FIG. 8, the write port 815 is represented by Write Port, and the read port 814 is represented by Read Port.

The read path circuit includes a sense amplifier 806, a read buffer 807 and a read latch 808.

An input end of the sense amplifier 806 is connected to the bit line signal end. An output end of the sense amplifier 806 is connected to an input end of the read buffer 807. An output end of the read buffer 807 is connected to an input end of the read latch 808. An output end of the read latch 808 outputs a read signal.

An enable signal connected to an enable end of the sense amplifier 806 is an SAE signal or an SAEN signal. The SAEN signal is an anti-phase signal of the SAE signal. In FIG. 8, the SAEN signal is represented by /SAE, and the SAE signal is directly represented by SAE. In some embodiments, the enable signal connected to the enable end of the sense amplifier 806 is an SAE signal.

An enable signal connected to an enable end of the read buffer 807 is an SAE signal or an SAEN signal. From FIG. 8, it can be seen that the read buffer 807 consists of a phase inverter with an enable end. In some embodiments, Enable signals connected to the enable end of the read buffer 807 are an SAE signal and an SAEN signal.

An enable signal connected to an enable end of the read latch 808 is an SAE signal or an SAEN signal. From FIG. 8, it can be seen that the read latch 808 is formed by interlocking a phase inverter with an enable end and a phase inverter without an enable end. In some embodiments, the enable signal connected to the enable end of the read latch 808 is an SAE signal or an SAEN signal.

The write path circuit includes a write selector 803, a write driver circuit 804 and a write latch (not shown).

An output end of the write driver circuit 804 is connected to an input end of the write selector 803. An output end of the write selector 803 acts as the output end of the write path circuit. An input end of the write driver circuit 804 is connected to an output end of the write latch. An input end of the write latch is connected to a write signal.

An enable signal connected to an enable end of the write selector 803 is a WE signal or WEN signal. The WEN signal is an anti-phase signal of the WE signal. From FIG. 8, it can be seen that the write selector 803 consists of a pair of NMOS. In FIG. 8, the WEN signal is represented by /WE. The WE signal (not shown) is obtained by inverting the phase of the WEN signal through a phase inverter.

An enable signal connected to an enable end of the write driver circuit 804 is a WE signal or WEN signal. The WEN signal is an anti-phase signal of the WE signal. In some embodiments, the enable signal connected to the enable end of the write selector 803 is the WE signal, and the enable signal connected to the enable end of the write driver circuit 804 is the WEN signal.

The data input into the input end of the write driver circuit 804 is a pair of data DATA and /DATA which are mutually anti-phase.

The read and write path decoupling circuit includes a fourth logic circuit 810. In the read and write modes, the fourth logic circuit 810 provides read and write control signals to the SAE signal.

In some embodiments, the fourth logic circuit 810 includes a first OR gate 811, a D flip-flop 812 and a second OR gate 813.

A first input end of the second OR gate 813 is connected to a write clock signal WCLK. A second input end is connected to a read clock signal RCLK. The output end of the second OR gate 813 is connected to a reset end of the D flip-flop 812.

A clock end of the D flip-flop 812 is connected to an address transition detection signal ATD_ADDR. A D end is connected to working voltage VDD. ATD stands for Address Transition Detection.

A first input end of the first OR gate 811 is connected to a Q end of the D flip-flop 812. A second input end of the first OR gate 811 is connected to a tracking bit line signal. An output end of the first OR gate 811 outputs the SAE signal.

The read and write path decoupling circuit of the SRAM provided by the embodiment of the present application can implement the read and write modes by changing the write path circuit detection mode of the design for testability circuit accordingly, and can simultaneously implement the write operation and read operation of the memory cell 801 with the 1RW single-port structure in the same read and write cycle, so that the memory cell 801 with the 1RW single-port structure can realize a dual-port function, thus improving the storage density of the SRAM with the dual-port function. From FIG. 8, it can be seen that the memory cell 801 in the read and write path decoupling circuit of the SRAM provided by the embodiment of the present application still uses the 1RW 6T memory cell illustrated in FIG. 7A, but the SRAM in the embodiment of the present application can also realize simultaneous read and write operations, which is equivalent to realizing the dual-port function. Therefore, compared with the 1R1W 8T memory cell illustrated in FIG. 7B, the embodiment of the present application can reduce the area of the memory cell with the dual-port function, thus finally improving the storage density of SRAM with the dual-port function.

The present application has been described in detail through specific embodiments above, which, however, do not constitute limitations to the present application. Without departing from the principle of the present application, those skilled in the art may make many changes and improvements, which should also be considered as included in the scope of protection of the present application.

What is claimed is:

1. A design for testability circuit of a static random access memory (SRAM), wherein
   the SRAM comprises a memory cell area and an external control circuit area;
   a memory cell array formed by arranging a plurality of memory cells is formed in the memory cell area and memory cells in a same column are connected to a same bit line;
   the external control circuit area comprises a write path circuit and a read path circuit;
   an output end of the write path circuit and an input end of the read path circuit are both connected to a bit line signal end, the bit line signal end is connected to a corresponding bit line through a write data bit multiplexer, and the bit line signal end is connected to the corresponding bit line through a read data bit multiplexer;
   the design for testability circuit comprises a fault diagnosis logic control module;
   the fault diagnosis logic control module is configured to control a fault diagnosis mode in a fault diagnosis process, and the fault diagnosis mode comprises a write path circuit detection mode; in the write path circuit detection mode, the write path circuit is in an on state, the write data bit multiplexer is in a selected state, and the read data bit multiplexer is in a deselected state, the read path circuit is in an on state and the memory cell is in a selected state; the write path circuit implements writing of the memory cell, and the read path circuit implements reading of the bit line signal end to implement detection of the write path circuit;
   the fault diagnosis mode further comprises a read path circuit detection mode;
   in the read path circuit detection mode, the write path circuit is in an off state, the write data bit multiplexer is in a selected state, the read data bit multiplexer is in a deselected state, the read path circuit is in an on state, the memory cell is in a deselected state, the bit line signal end is connected to a test signal outputted by a signal generation circuit, and the read path circuit implements reading of the test signal to implement detection of the read path circuit, wherein the read path circuit comprises a sense amplifier, a read buffer, and a read latch;
   an input end of the sense amplifier is connected to the bit line signal end, an output end of the sense amplifier is connected to an input end of the read buffer, an output end of the read buffer is connected to an input end of the read latch, and an output end of the read latch outputs a read signal;
   an enable signal connected to an enable end of the sense amplifier is an SAE signal or an SAEN signal; the SAEN signal is an anti-phase signal of the SAE signal;
   an enable signal connected to an enable end of the read buffer is an SAE signal or an SAEN signal;
   an enable signal connected to an enable end of the read latch is an SAE signal or an SAEN signal;
   the fault diagnosis logic control module comprises a DFT signal generation module configured to generate a DFT signal;
   in fault diagnosis detection, the DFT signal is provided to the SAE signal;
   the write path circuit comprises a write selector, a write driver circuit and a write latch;
   an output end of the write driver circuit is connected to an input end of the write selector, an output end of the write selector acts as the output end of the write path circuit, an input end of the write driver circuit is connected to an output end of the write latch, and an input end of the write latch is connected to a write signal;
   an enable signal connected to an enable end of the write selector is a WE signal or WEN signal, and the WEN signal is an anti-phase signal of the WE signal; and
   an enable signal connected to an enable end of the write driver circuit is a WE signal or WEN signal.

2. The design for testability circuit of the SRAM according to claim 1, wherein, in the write path circuit detection mode, the DFT signal makes the sense amplifier, the read buffer, and the read latch enabled; and
   the WE signal or the WEN signal makes the write selector, the write driver circuit and the write latch enabled.

3. The design for testability circuit of the SRAM according to claim 2, wherein a working mode of the SRAM comprises a write mode and a read mode;
   in the write mode, the write path circuit is in an on state, the write data bit multiplexer is in a selected state, the read data bit multiplexer is in a deselected state, the read path circuit is in an off state, and the memory cell is in a selected state;
   in the read mode, the write path circuit is in an off state, the write data bit multiplexer is in a deselected state, the read data bit multiplexer is in a selected state, the read path circuit is in an on state, and the memory cell is in a selected state;

the external control circuit area further comprises a tracking circuit, the tracking circuit comprises a tracking cell, the tracking cell has a same structure as the memory cell, the tracking cell is connected to a tracking bit line, and the tracking bit line provides a tracking bit line signal; and in the write mode, the SAE signal is provided by the tracking bit line signal and makes the sense amplifier, the read buffer, and the read latch disabled.

4. The design for testability circuit of the SRAM according to claim 3, wherein the SAE signal is obtained by logically combining the tracking bit line signal and the DFT signal by a first logic circuit;

the write path circuit detection mode is obtained by adding the DFT signal on the basis of the write mode;

in the write mode, the DFT signal is not added and the first logic circuit takes the tracking bit line signal as the SAE signal; and in the write path circuit detection mode, the DFT signal is added, the first logic circuit takes the DFT signal as the SAE signal, and the DFT signal makes the write mode changed to the write path circuit detection mode.

5. The design for testability circuit of the SRAM according to claim 4, wherein in a case that the SAE signal is high-level, the sense amplifier, the read buffer, and the read latch are enabled; and the first logic circuit is a first OR gate.

6. The design for testability circuit of the SRAM according to claim 3, wherein in the write mode, a write address signal is added to a select end of the write data bit multiplexer to make the write data bit multiplexer in a selected state; and in the read mode, a read address signal is added to a select end of the read data bit multiplexer to make the read data bit multiplexer in a selected state.

7. The design for testability circuit of the SRAM according to claim 6, wherein in the read path circuit detection mode, the DFT signal is added to the select end of the read data bit multiplexer to make the read data bit multiplexer in a deselected state; and the test signal is obtained from the tracking bit line signal.

8. The design for testability circuit of the SRAM according to claim 7, wherein the bit line connected to each memory cell comprises an in-phase line and anti-phase line;

the bit line signal end comprises an in-phase line signal end and an anti-phase line signal end;

the tracking bit line comprises an in-phase tracking bit line and an anti-phase tracking bit line, and the tracking bit line signal comprises an in-phase tracking bit line signal and an anti-phase tracking bit line signal; and the signal generation circuit adopts the tracking circuit, and the test signal is obtained from the anti-phase tracking bit line signal.

9. The design for testability circuit of the SRAM according to claim 8, wherein a signal at the select end of the read data bit multiplexer is obtained by logically combining the read address signal and the DFT signal by a second logic circuit;

the anti-phase tracking bit line signal is input to an input end of a third logic circuit, and an output end of the third logic circuit outputs the test signal under the control of a control signal;

the read path circuit detection mode is obtained by making the memory cell in a deselected state and adding the DFT signal and the control signal of the third logic circuit on the basis of the read mode;

in the read mode, the DFT signal and the control signal of the third logic circuit are not added, the second logic circuit makes the signal at the select end of the read data bit multiplexer be the read address signal, and the third logic circuit makes the test signal not outputted to the bit line signal end; and in the read path circuit detection mode, the DFT signal and the control signal of the third logic circuit are added, the second logic circuit makes the signal at the select end of the read data bit multiplexer be the DFT signal, and the third logic circuit makes the test signal outputted to the bit line signal end.

10. The design for testability circuit of the SRAM according to claim 9, wherein in a case that the signal at the select end of the read data bit multiplexer is low-level, the read data bit multiplexer is made in a selected state, and in a case that the signal at the select end of the read data bit multiplexer is high-level, the read data bit multiplexer is made in a deselected state; and the second logic circuit is a first OR NOT gate.

11. The design for testability circuit of the SRAM according to claim 9, wherein the third logic circuit comprises a first transmission gate and a second transmission gate;

an input end of the first transmission gate is connected to the anti-phase tracking bit line signal, and an output end of the first transmission gate is connected to an in-phase bit line signal end;

an input end of the second transmission gate is connected to the anti-phase tracking bit line signal, and an output end of the second transmission gate is connected to an anti-phase bit line signal end;

the control signal of the third logic circuit comprises a first select signal and a second select signal which are mutually anti-phase;

an in-phase control end of the first transmission gate and an anti-phase control end of the second transmission gate are connected to the first select signal; and an anti-phase control end of the first transmission gate and an in-phase control end of the second transmission gate are connected to the second select signal.

12. A read and write path decoupling circuit of a static random access memory (SRAM), wherein the SRAM comprises a memory cell area and an external control circuit area;

a memory cell array formed by arranging a plurality of memory cells is formed in the memory cell area and memory cells in a same column are connected to a same bit line;

the external control circuit area comprises a write path circuit and a read path circuit;

an output end of the write path circuit and an input end of the read path circuit are both connected to a bit line signal end, the bit line signal end is connected to a corresponding bit line through a write data bit multiplexer, and the bit line signal end is connected to the corresponding bit line through a read data bit multiplexer;

each memory cell adopts a 1RW single-port structure;

the read and write path decoupling circuit is configured to implement read and write modes in a working process of the SRAM; in the read and write modes, the write path circuit is in an on state, the write data bit multiplexer is in a selected state, the read data bit multiplexer is in a deselected state, the read path circuit is in an on state, and the memory cell is in a selected state; and the write path circuit implements writing of the memory cell and makes an input end of the write path circuit be a write port, the read path circuit implements reading of the bit line signal end and makes an output end of the read path circuit be a read port, so that the memory cell with the 1RW single-port structure realizes a dual-port function to improve storage density, wherein the read path circuit comprises a sense amplifier, a read buffer, and a read latch;

an input end of the sense amplifier is connected to the bit line signal end, an output end of the sense amplifier is connected to an input end of the read buffer, an output end of the read buffer is connected to an input end of the read latch, and an output end of the read latch outputs a read signal;

an enable signal connected to an enable end of the sense amplifier is an SAE signal or an SAEN signal; the SAEN signal is an anti-phase signal of the SAE signal;

an enable signal connected to an enable end of the read buffer is an SAE signal or an SAEN signal;

an enable signal connected to an enable end of the read latch is an SAE signal or an SAEN signal;

the write path circuit comprises a write selector, a write driver circuit and a write latch;

an output end of the write driver circuit is connected to an input end of the write selector, an output end of the write selector acts as the output end of the write path circuit, an input end of the write driver circuit is connected to an output end of the write latch, and an input end of the write latch is connected to a write signal;

an enable signal connected to an enable end of the write selector is a WE signal or WEN signal, and the WEN signal is an anti-phase signal of the WE signal;

an enable signal connected to an enable end of the write driver circuit is a WE signal or WEN signal; and the read and write path decoupling circuit comprises a fourth logic circuit, and in the read and write modes, the fourth logic circuit provides read and write control signals to the SAE signal.

13. The read and write path decoupling circuit of the SRAM according to claim 12, wherein the fourth logic circuit comprises a first OR gate, a D flip-flop, and a second OR gate;

a first input end of the second OR gate is connected to a write clock signal, a second input end is connected to a read clock signal, and an output end of the second OR gate is connected to a reset end of the D flip-flop;

a clock end of the D flip-flop is connected to an address transition detection signal, and a D end is connected to working voltage; and a first input end of the first OR gate is connected to a Q end of the D flip-flop, a second input end of the first OR gate is connected to a tracking bit line signal, and an output end of the first OR gate outputs the SAE signal.

\* \* \* \* \*